(12) United States Patent
Zheng et al.

(10) Patent No.: US 10,566,364 B2
(45) Date of Patent: Feb. 18, 2020

(54) RESONANT-FILTER IMAGE SENSOR AND ASSOCIATED FABRICATION METHOD

(71) Applicant: OmniVision Technologies, Inc., Santa Clara, CA (US)

(72) Inventors: Yuanwei Zheng, San Jose, CA (US); Gang Chen, San Jose, CA (US); Duli Mao, Sunnyvale, CA (US); Dyson H. Tai, San Jose, CA (US); Lequn Liu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/276,561

(22) Filed: Feb. 14, 2019

(65) Prior Publication Data

US 2019/0181173 A1 Jun. 13, 2019

Related U.S. Application Data

(62) Division of application No. 15/195,926, filed on Jun. 28, 2016, now Pat. No. 10,290,670.

(51) Int. Cl.
*H01L 27/146* (2006.01)

(52) U.S. Cl.
CPC .. *H01L 27/14625* (2013.01); *H01L 27/14621* (2013.01); *H01L 27/14605* (2013.01); *H01L 27/14643* (2013.01); *H01L 27/14685* (2013.01)

(58) Field of Classification Search
CPC ......... H01L 27/14625; H01L 27/14685; H01L 27/14627; B82Y 20/00; Y10S 977/773; Y10S 977/834
See application file for complete search history.

(56) References Cited

U.S. PATENT DOCUMENTS

| 9,362,324 | B1 | 6/2016 | Astratov | |
|---|---|---|---|---|
| 2002/0102498 | A1* | 8/2002 | Hsin | G02B 3/0068 430/321 |

(Continued)

FOREIGN PATENT DOCUMENTS

TW 1418024 B 12/2013

OTHER PUBLICATIONS

Li Na Ng, "Mie Theory," chapter 3 of "Manipulation of Particles on Optical Waveguides," Doctoral Thesis, University of Southampton, (2000); pp. 23-65.

(Continued)

*Primary Examiner* — Thanh Luu
(74) *Attorney, Agent, or Firm* — Lathrop GPM LLP

(57) ABSTRACT

A resonant-filter image sensor includes a pixel array including a plurality of pixels and a microresonator layer above the pixel array. The microresonator layer includes a plurality of microresonators formed of a first material with an extinction coefficient less than 0.02 at a free-space wavelength of five hundred nanometers. Each of the plurality of pixels may have at least one of the plurality of microresonators at least partially thereabove. The resonant-filter image sensor may further include a layer covering the microresonator layer that has a second refractive index less than a first refractive index, the first refractive index being the refractive index of the first material. Each microresonator may be one of a parallelepiped, a cylinder, a spheroid, and a sphere.

5 Claims, 9 Drawing Sheets

(56) References Cited

U.S. PATENT DOCUMENTS

| 2004/0082096 | A1* | 4/2004 | Yamamoto | H01L 27/14621 |
| | | | | 438/70 |
| 2004/0161868 | A1 | 8/2004 | Hong | |
| 2011/0001206 | A1 | 1/2011 | Li et al. | |
| 2012/0092747 | A1* | 4/2012 | Martin | G02B 3/0012 |
| | | | | 359/290 |

OTHER PUBLICATIONS

Fu, W.Y. et al., Nanosphere Lithography for Nitride Semiconductors, InTech, 2010, pp. 615-628.

Guo, H., et al., Near-field focusing of the dielectric microsphere with wavelength scale radius, Optics Express vol. 21 No. 2, Jan. 28, 2013, 10 pages.

Hong, S-H. et al., Replication of high ordered nano-sphere array by nanoimprint lithography, Microelectronic Engineering 86, 2009, pp. 2423-2426.

Ioppolo, T. et al., Whispering gallery modes of microspheres in the presence of a changing surrounding medium: A new ray-tracing analysis and sensor experiment, Journal of Applied Physics 107, 2010, 8 pages.

Zheng, Y.W. et al., Dry laser cleaning of particles from solid substrates: Experiments and theory, Journal of Applied Physics vol. 90, No. 5, Sep. 1, 2015, pp. 2135-2142.

Luk'Yanchuk, B. S. et al., Basic physical problems related to dry laser cleaning, RIKEN Review No. 43, Jan. 2002, pp. 28-34.

Huang, S. M. et al., Pulsed laser-assisted surface structuring with optical near-field enhanced effects, Journal of Applied Physics vol. 92, No. 5, Sep. 1, 2002, pp. 2495-2500.

Wang, Z. et al. Near-field focusing of dielectric microspheres: Super-resolution and field-invariant parameter scaling, 14 pages.

Luk'Yanchuk, B. S. et al., Laser cleaning of solid surface: Optical resonance and near-field effects, SPIE vol. 4065, 2000, pp. 576-587.

Luk'Yanchuk, B. S. et al., Optimum Forward Light Scattering by Spherical and Spheroidal Dielectric Nanoparticles with High Refractive Index, American Chemical Society, 2015, pp. 993-999.

Munzer, H-J. et al., Optical Near Field Effects in Surface Nanostructuring and Laser Cleaning, SPIE 4426, 2002, pp. 180-183.

Park, H. et al, Vertically Stacked Photodetector Devices Containing Silicon Nanowires with Engineered Absorption Spectra, ACS Photonics, Mar. 16, 2015, pp. 554-549.

Park, H. et al., Filter-Free Image Sensor Pixels Comprising Silicon Nanowires with Selective Color Absorption, Nano Letters, Mar. 3, 2014, pp. 1804-1809.

Savelev, R. S. et al., Subwavelength waveguides composed of dielectric nanoparticles, Physical Review B 89, Jan. 30, 2014, 7 pages.

Evlyukhin, A. B. et al., Optical response features of Si-nanoparticle arrays, Physical Review B 82, Jul. 8, 2010, 12 pages.

Schweiger, G. et al., Effect of changes in size and index of refraction on the resonance wavelength of microspheres, J. Opt. Soc. Am. B/vol. 23 No. 2, Feb. 2006, pp. 212-217.

Spinelli, P. et al., Broadband omnidirectional antireflection coating based on subwavelength surface Mie resonators, Nature Communications, Feb. 21, 2012, 5 pages.

Tanaka, Y. et al., Near-field interaction of two-dimensional high-permittivity spherical particle arrays on substrate in the Mie resonance scattering domain, Optics Express, vol. 18 No. 26, Dec. 20, 2010, 12 pages.

Teraoka, I. et al., Perturbation approach to resonance shifts of whispering-gallery modes in a dielectric microsphere as a probe of a surrounding medium, J. Opt. Soc. Am. B, vol. 20 No. 9, Sep. 2003, pp. 1937-1946.

Wang, Z. B. et al., Angle effect in laser nanopatterning with particle-mask, J. of Applied Physics vol. 96 No. 11, Dec. 1, 2004, pp. 6845-6850.

Zhang, Y. et al., Dielectric spheres with maximum forward scattering and zero backscattering: a search for their material composition, Journal of Optics No. 17, Sep. 24, 2015, 4 pages.

Zhao, Q. et al., Mie resonance-based dielectric metamaterials, Materials Today vol. 12 No. 12, Dec. 2009, pp. 61-69.

Taiwan Patent Application No. 106120973, English translation of Office Action dated Sep. 27, 2018, 3 pages.

Taiwanese Patent Application No. 106120973, English translation of Office Action dated May 16, 2018, 2 pages.

U.S. Appl. No. 15/195,926 Office Action dated Aug. 15, 2018, 6 pages.

* cited by examiner

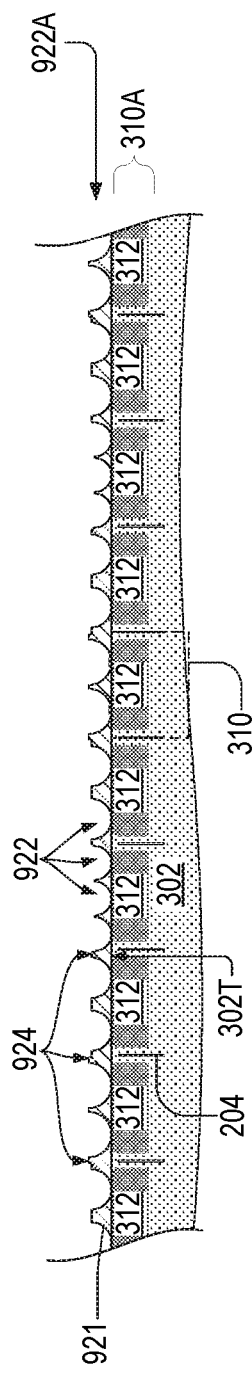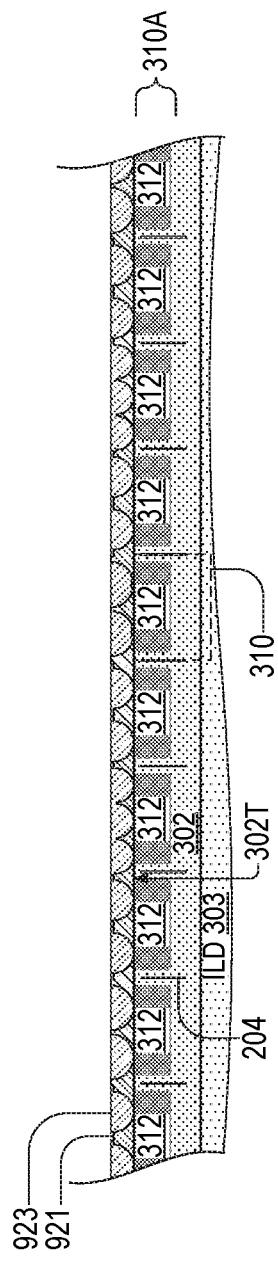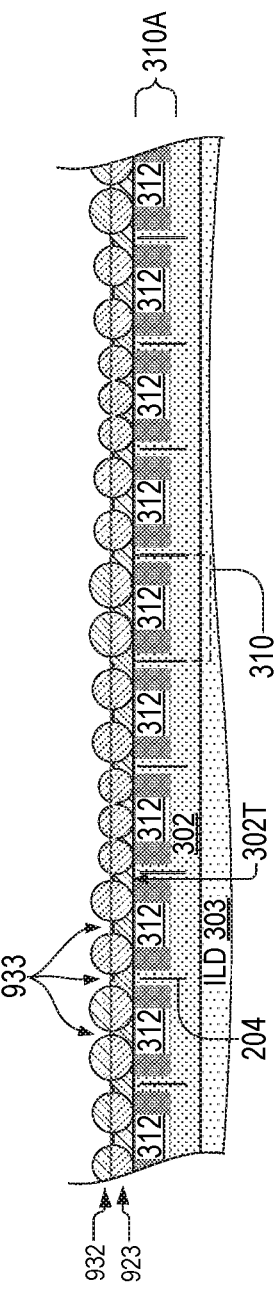

RESONANT-FILTER IMAGE SENSOR AND ASSOCIATED FABRICATION METHOD

CROSS REFERENCE TO RELATED APPLICATIONS

This application is a divisional application of U.S. patent application Ser. No. 15/195,926 filed Jun. 28, 2016, the entire content of which is incorporated herein by reference.

BACKGROUND

Many high-volume consumer products such as mobile devices and motor vehicles now include at least one digital camera. For example, FIG. 1 shows a mobile device 190 having a camera module 180 integrated therein. Camera module 180 includes an image sensor 100 beneath an imaging lens 170.

FIG. 2 is a cross-sectional view of image sensor 100. Image sensor 100 includes a semiconductor layer 202, a color filter array (CFA) 220A, and a microlens array 230A. Semiconductor layer 202 includes a pixel array 210A, which includes a plurality of pixels 210 that each have a photodiode region 212. Microlens array 230A includes a plurality of microlenses 230. A photodiode isolation structure 204 is between adjacent photodiode regions 212.

Each photodiode region 212 extends a distance 212H from a top surface 202T from semiconductor layer 202. Distance 212H is for example twenty micrometers beneath a color filter 220(R) to allow for sufficient absorption of red light within photodiode region 212.

Color filters 220 are typically dye filters that absorb one or more wavelength ranges of visible light such that each pixel 210 is characterized by one or more wavelength bands of visible light to which it responds, e.g., red, green, blue, cyan, magenta, and yellow. In FIG. 2, each color filter 220 is one of a red (R), green (G), and blue (B) filter, denoted by 220(R), 220(G), and 220(B), respectively. Each color filter 220 as a height 220H. In addition to distance 212H, height 220H limits how thin image sensor 110 can be, which in turn limits its value in devices where compactness is a key functional and/or value-added feature.

SUMMARY OF THE INVENTION

In one embodiment, a resonant-filter image sensor is disclosed. The resonant-filter image sensor includes a pixel array including a plurality of pixels and a microresonator layer above the pixel array. The microresonator layer includes a plurality of microresonators formed of a first material with an extinction coefficient less than 0.02 at a free-space wavelength of five hundred nanometers.

In another embodiment, a method for forming a microresonator array on a substrate is disclosed. The method includes (a) forming an array of cavities in a first layer on the substrate, wherein the first layer is formed of a first material. The method also includes: (b) forming a plurality of bottom-half microresonators by filling each cavity with a second material, and (c) forming an array of microresonators, formed of the second material, each microresonator including one of the plurality of bottom-half microresonators, and being covered by a layer of the first material.

BRIEF DESCRIPTION OF THE FIGURES

FIGS. 9A, 9B, and 9C are cross-sectional views of the FIG. 3 pixel array corresponding to steps of the FIG. 8 method, in an embodiment.

DETAILED DESCRIPTION OF THE EMBODIMENTS

Figure 1:
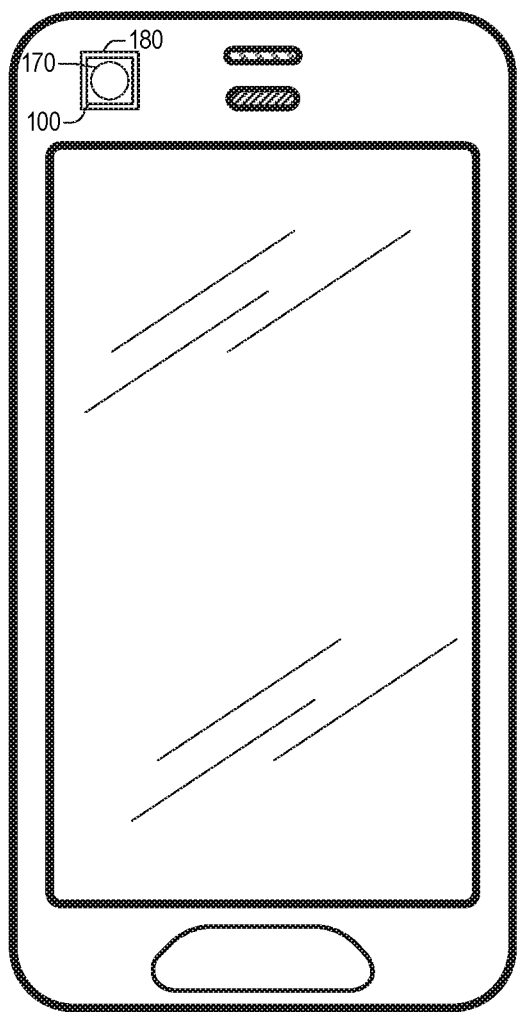
FIG. 1 shows a prior-art mobile device having an integrated camera module that has an image sensor.
Figure 2:
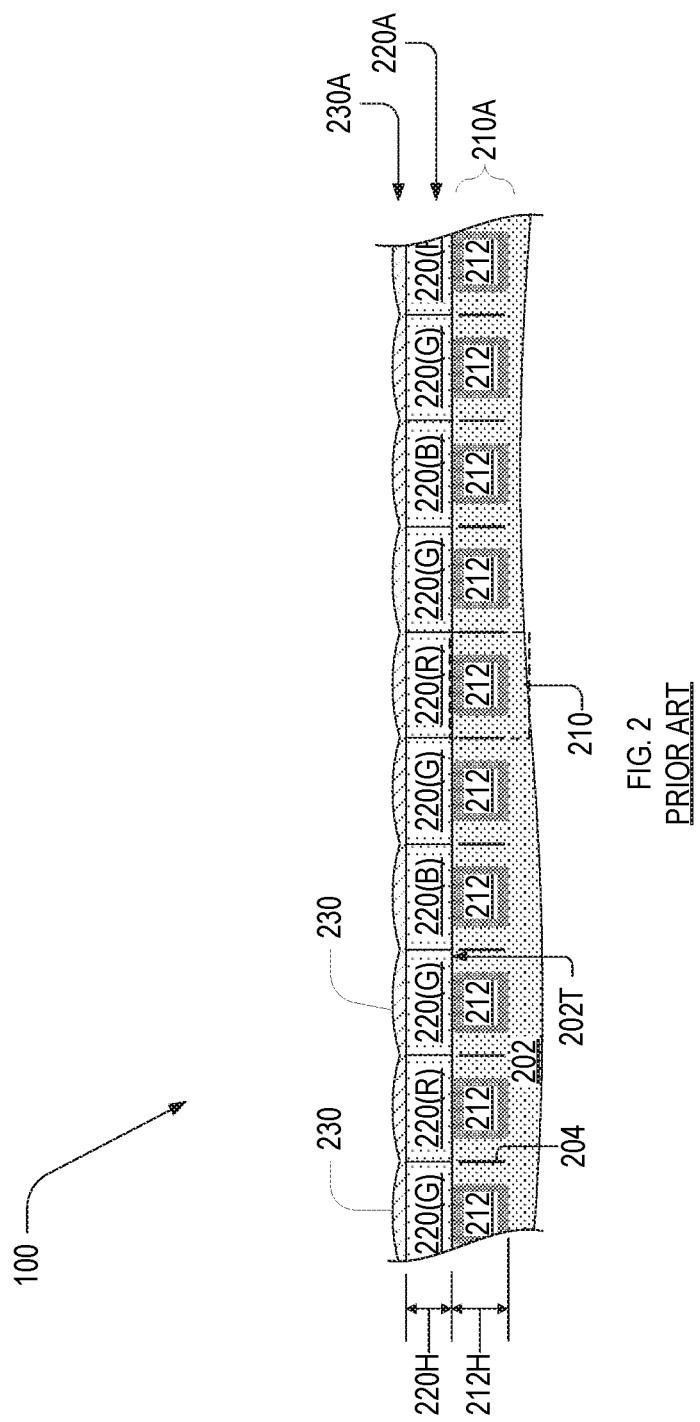
FIG. 2 is a cross-sectional view of the image sensor of FIG. 1.
Figure 3:
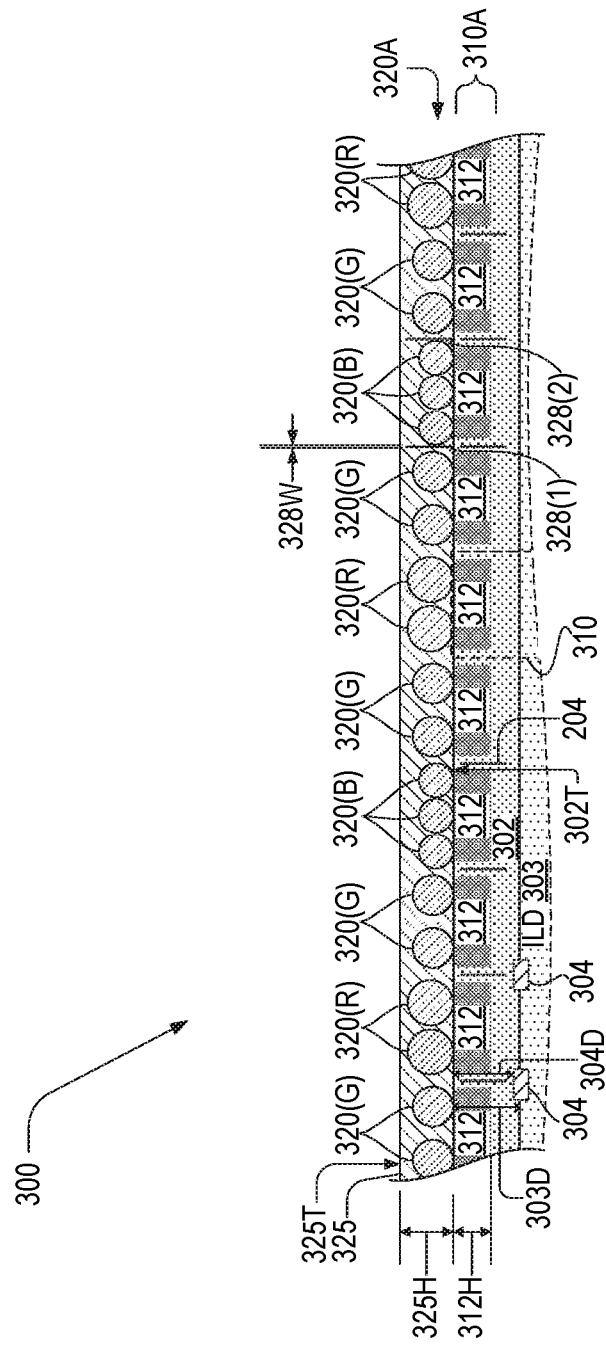
FIG. 3 is a cross-sectional view of a first resonant-filter image sensor that includes a pixel array and a microresonator layer thereon, in an embodiment.

FIG. 3 is a cross-sectional view of a resonant-filter image sensor 300 that includes a pixel array 310A and a microresonator layer 320A thereon. Pixel array 310A includes a plurality of pixels 310 within a semiconductor layer 302 that has photodiode regions 312. Whereas FIG. 3 illustrates ten pixels 310, for clarity of illustration only one is denoted with a reference numeral.

Photodiode regions 312 extend a maximum distance 312H from a top surface 302T of semiconductor layer 302. Photodiode regions 312 may be periodically-spaced within semiconductor layer 302. Microresonator layer 320A functions as a replacement of CFA 220A, and in some embodiments, also as a replacement of microlens array 230A.

Microresonator layer 320A includes a plurality of microresonators 320. Each microresonator 320 is depicted as a sphere, but may be a different shape, such as a spheroid, or a cylinder having an axis perpendicular to a top surface 302T of semiconductor layer 302. Microresonators 320 have different radii according to their position in microresonator layer 320A. In FIG. 3 each microresonator 320(R), 320(G), and 320(B) has a resonance wavelength corresponding to red light, green light, and blue light, respectively. For example, microresonators 320(R), 320(G), and 320(B) have respective radii $r_R$=300 nm, $r_G$=265 nm, and $r_B$=225 nm. In FIG. 3, each photodiode region 312 has either two or three microresonators 320 thereabove. A photodiode region 312 may have any number of microresonators 320 thereabove without departing from the scope hereof.

Microresonators 320 may be coated with a low-index layer 325 that has a lower refractive index than any microresonator 320. For example, microresonators 320 have a complex refractive index $N_{320}=n_{320}+i\kappa_{320}$, where $n_{320}=1.6$ and low-index layer 325 has a refractive index $n_{325}<n_{320}$. For example, low-index layer 325 is formed of an aerogel, such that $1<n_{325}<1.005$ (or $1<n_{325}<1.3$ for higher-index aerogels) at visible and/or near-infrared (near-IR) wavelengths. Microresonators 320 have relatively low loss, compared to silicon for example, such that extinction coefficient $\kappa_{320}<0.02$ at visible and/or near-IR wavelengths.

Microspheres similar to microresonators 320 have been used for dry laser cleaning of substrates of microelectronic devices. Light incident upon microresonators 320 can excite resonant modes therein and produce, via near-field focusing, enhanced intensities at top surface 302T. This enhanced intensity at top surface 302T, as compared to top surface 202T, enables photodiode regions 312 to absorb the same amount of light within a shorter distance. Specifically, distance 312H may be less than distance 212H. In an embodiment, distance 312H is less than three micrometers. Minimizing distance 312H is especially beneficial at wavelengths, such as near-IR wavelengths, where silicon absorption is relatively small.

Distance 312H being relatively small enables the positioning of opaque elements beneath photodiode regions 312 such that they are located closer to top surface 302T than previously possible. For example, resonant-filter image sensor 300 optionally includes one or more opaque elements 304, isolation structures 204, and an inter-layer dielectric (ILD) layer 303. Opaque elements 304 may be at least partially embedded in ILD layer 303 and may be located beneath one or both of a photodiode region 312 and one isolation structure 204. ILD layer 303 and opaque elements 304 are located at distances 303D and 304D from top surface 302T, respectively, which exceed distance 312H. Distances 303D and 304D may each be less than ten micrometers. For example, distance 303D equals four micrometers and distance 304D may equal distance 303D. Distances 303D and 304D may be more or less than ten micrometers as well without departing from the scope hereof.

Moreover, the lens-like properties of microresonators 320 (e.g., when microresonators 320 are spherical), may eliminate the need for a microlens array above pixel array 310A. Accordingly, resonant-filter image sensor 300 may have a top surface that includes top surfaces of microresonators 320. Alternatively, resonant-filter image sensor 300 has a planar top surface, such as a top surface 325T of low-index layer 325. Low-index layer 325 has a height 325H that is less than height 220H. Height 325H equals 750 nm, for example.

Microresonators 320(R), 320(G), and 320(B) are arranged as illustrated in FIG. 3 for illustrative purposes. Microresonators 320(R), 320(G), and 320(B) may be arranged differently with respect to one another, for example, to match a pattern of CFAs used in the art such as a Bayer pattern.

Resonant-filter image sensor 300 may also include a plurality of baffles 328 in low-index layer 325 for reducing cross-talk between adjacent pixels. A pair of baffles 328(1,2) is for example center-aligned with one photodiode region 312. Baffles 328 have a refractive index $n_{328}$ that is lower than that of low-index layer 325: $n_{328} < n_{325}$. For example, $n_{325} = 1.45$ and $n_{328} = 1.40$. Adjacent baffles 328, such as baffles 328(1,2), and the portion of low-index layer 325 therebetween form a waveguide when a width 328W of baffles 328 is sufficient to adequately contain evanescent fields propagating therein from incident light thereon. Width 328W is for example between 40 nm and 100 nm. Baffles 328 may be perpendicular to top surface 325T to within ±3°. A baffle 328 may span surfaces 302T and 325T. Alternatively, one or more baffles 328 may be completely embedded by low-index layer 325 or may protrude above surface 325T.

Figure 4:
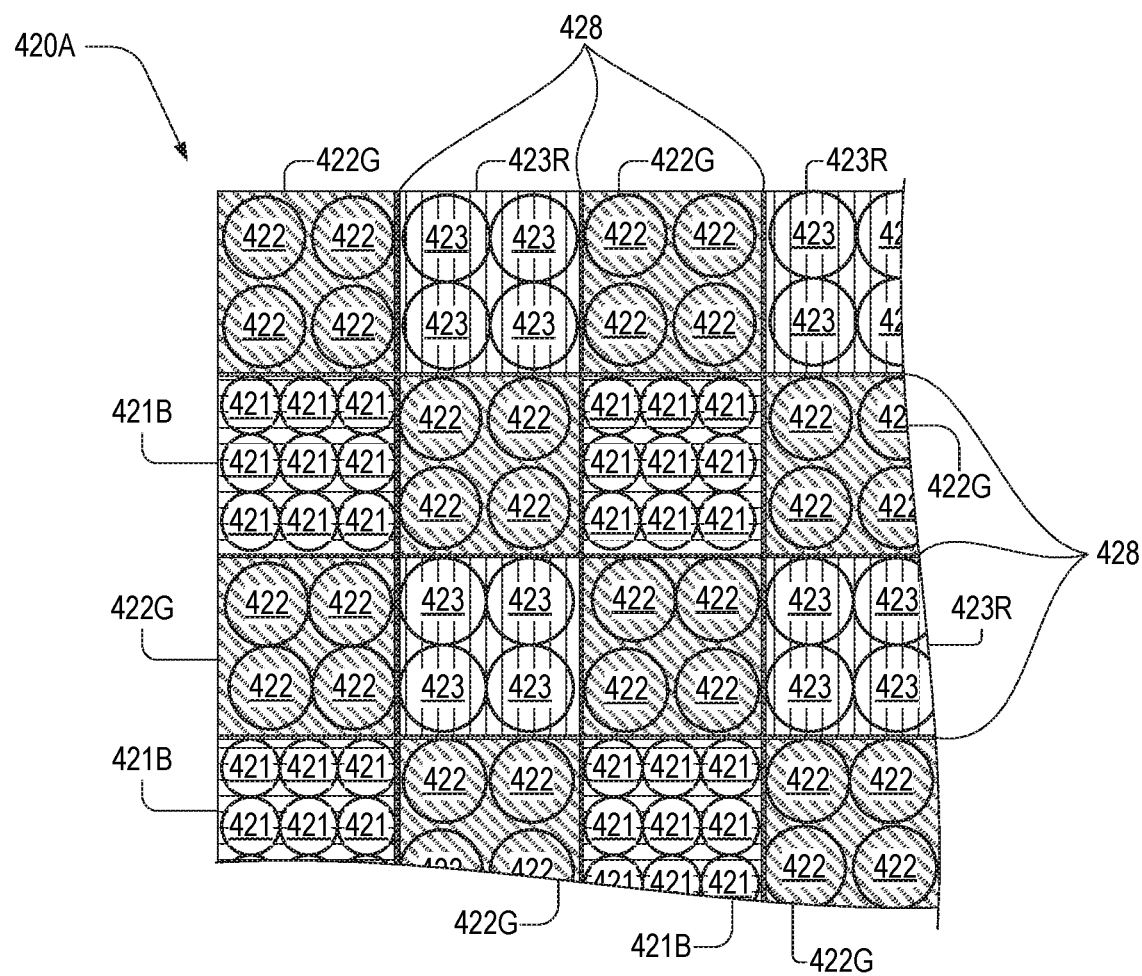
FIG. 4 is a plan view of a portion of microresonator layer, which as an example of microresonator layer of FIG. 3.

FIG. 4 is a plan view of a portion of a microresonator layer 420A, which as an example of microresonator layer 320A. Microresonator layer 420A includes a plurality of microresonators 421, 422, and 423 corresponding to a first, second, and third size range respectively. Microresonators 421, 422, and 423 are similar to microresonators 320(B), 320(G), and 320(R), respectively. Each size range corresponds to a range of design wavelengths. Microresonators 421, 422, and 423 have respective design wavelengths in the following ranges: 450 nm±25 nm, 530±25 nm, and 600±25 nm. For example, a first microresonator 421 is sized for a design wavelength of 440 nm, and a second microresonator 421 sized for a design wavelength of 460 nm.

Microresonators 421-423 having a design wavelength within the same range are similarly sized. For example, a maximum diameter difference between two microresonators 421 is ten percent. Similarly, a maximum diameter difference between any two microresonators 422 (or any two microresonators 423) is also ten percent.

Microresonator layer 420A includes sixteen regions of each designated as one of region 421B, region 422G, and region 423R. Regions 421B, 422G, and 423R are arranged such that microresonator layer 420A mimics a Bayer pattern. Regions 421B, 422G, and 423R may be arranged, via three interleaved periodic arrays of respective regions 421B, 422G, and 423R for example, to mimic other color filter arrays known in the art.

Each region 421B includes at least one microresonator 421 and corresponds to a blue color filter. Each region 422G includes at least one microresonator 422 and corresponds to a green color filter. Each region 423R includes at least one microresonator 423 and corresponds to a red color filter. Microresonator layer 420A may also include a plurality of baffles 428, which are similar to baffles 328.

Figure 5:
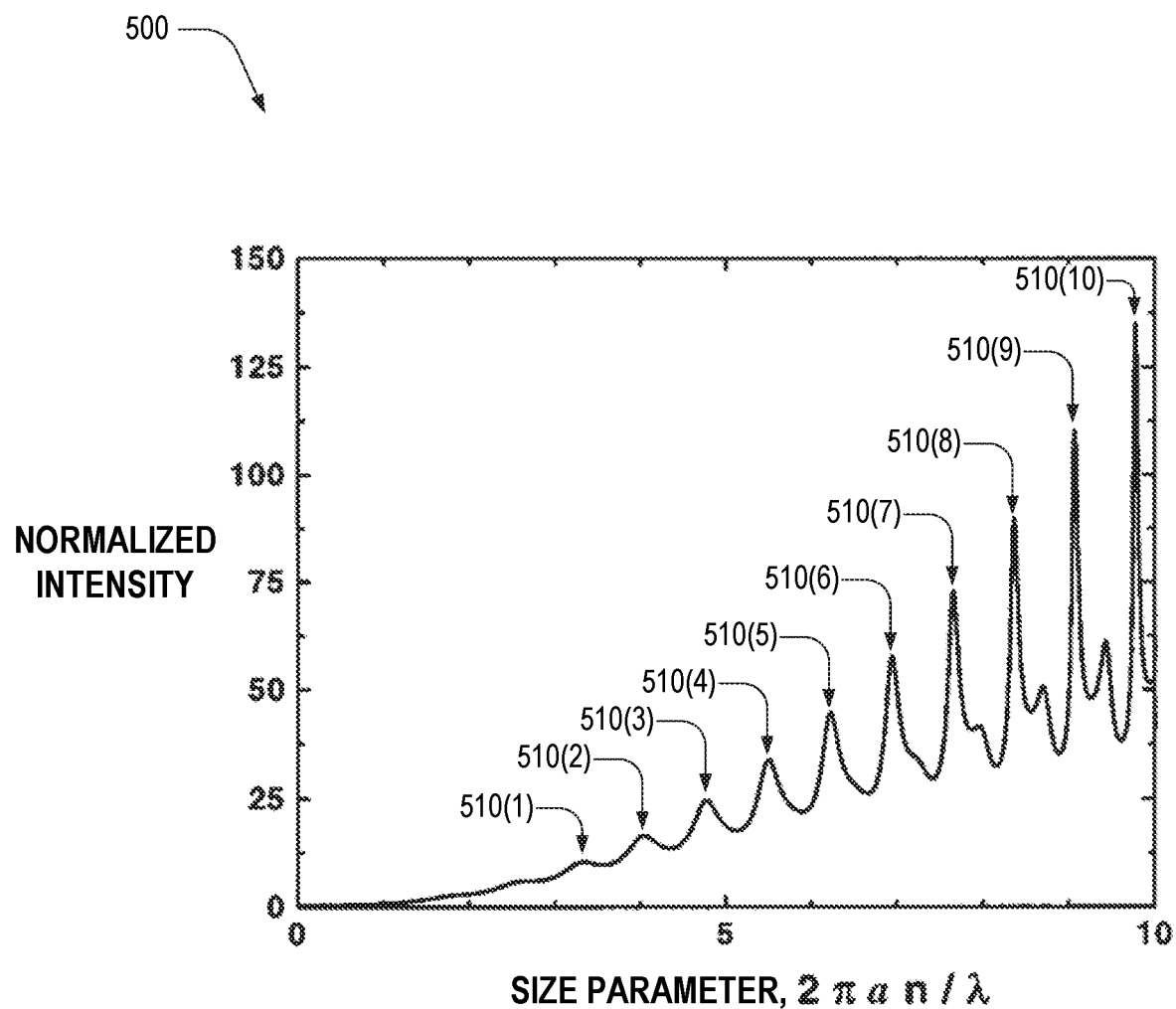
FIG. 5 is a plot of normalized light intensity beneath a dielectric microsphere with refractive index n=1.6 as a function of microsphere size parameter q.

FIG. 5 is a plot 500 of normalized light intensity beneath a dielectric microsphere with refractive index n=1.6 as a function of microsphere size parameter q, as according to Mie solution to Maxwell's equations, as computed by Huang et al, *J. Appl. Phys.* 92, 2495 (2002). Size parameter q is a function of microsphere refractive index n, microsphere radius r, and wavelength $\lambda_q$ of light incident on the sphere: $q = 2\pi r n / \lambda_q$. Wavelength $\lambda_q$ may be a free-space wavelength $\lambda_0$ or a wavelength within the medium surrounding the microsphere, e.g., low-index layer 325 such that $\lambda_q = \lambda_0 / n_{325}$.

The normalized intensity has peaks 510(1-10) that correspond to respective size parameters $q_{410}(1-10) = 3.3, 4.0, 4.8, 5.5, 6.2, 6.9, 7.7, 8.4, 9.1$, and 9.8. In an embodiment, microresonators 320 have n=1.6 and, for a design wavelength $\lambda_q$, a size parameter $q_{410}(i) \pm 0.1$, where i is an integer between one and ten inclusive. Such microresonators 320 are for example formed of polystyrene or other polymer. Wavelength $\lambda_q$ for example corresponds to one of red, green, and blue light. For example, design wavelength $\lambda_q$ may be in one of the following ranges: (a) 450±25 nm, (b) 530±25 nm, and (c) 600±25 nm.

Near-field enhancement beneath spherical microresonator 320 depends on both on its refractive index and the free-space wavelength $\lambda_0$ of light incident thereon. Tanaka et al. (Opt. Express 18, 27226 (2010)) discuss peaks in near-field efficiency $Q_{nf}$ beneath dielectric nanospheres as a function of nanosphere refractive index $n(\lambda_0)$ and diameter D. For $D = \lambda_q / 4$, $Q_{nf}(n)$ has a peak value at $n(\lambda_0) = 3.82$. For $D = \lambda_q / 2$, $Q_{nf}(n)$ exhibits a peak at $n(\lambda_0) = 2.72$ and values thereabove. For $D = \lambda_0$, $Q_{nf}(n)$ exhibits a peak at $n(\lambda_q) \cong 1.75$ and values thereabove including $n(\lambda_q) \cong 2.1$ and $n(\lambda_q) \cong 2.4$. Accordingly, for a design wavelength $\lambda_q$, examples of a microresonator 320 have one of (a) $D = \lambda_q / 4$ and $n(\lambda_q) = 3.82 \pm 0.2$, (b) $D = \lambda_q / 2$ and $n(\lambda_q) \geq 2.7$, and (c) $D = \lambda_q$ and $n(\lambda_q)$ satisfying one of $n(\lambda_q) = 1.75 \pm 0.2$, $n(\lambda_q) = 2.1 \pm 0.2$, and $n(\lambda_q) = 2.4 \pm 0.2$.

Near-field light intensities may be enhanced beneath pairs of adjacent microresonators with no gap therebetween, as discussed by Tanaka et al. Accordingly, adjacent microresonators 320 may be touching to enhance detection by photodiode region 312. Alternatively, adjacent microresonators 320 may have a gap therebetween filled with a portion of low-index layer 325.

Microresonator layer 320A may include microresonators 320 that have a refractive index that optimizes directional scattering of light incident thereon. Directional scattering includes forward scattering of incident light toward photodiode regions 312 and backward scattering of light away from photodiode regions 312. Ideal optimized directional scattering corresponds to maximized total scattering and forward scattering and minimized backward scattering. Yan Zhang et al. (*Journal of Optics*, Vol. 17, article 105612) found that microspheres with refractive index n=2.47 have "maximum forward scattering without backwards scattering of light" when size parameter $$q = \frac{2\pi r n_{320}}{\lambda} = 2.75.$$

Luk'anchuk et al. (*ACS Photonics*, 2015, 2 (7), pp 993-999) found similar results. Accordingly, in an embodiment, microresonators 320 are spherical with a refractive index of $n_{320}=2.47\pm0.1$ at a wavelength between 0.4 μm and 2.0 μm, and satisfy $$q = \frac{2\pi r n_{320}}{\lambda} = 2.75 \pm 0.1.$$

Figure 6:
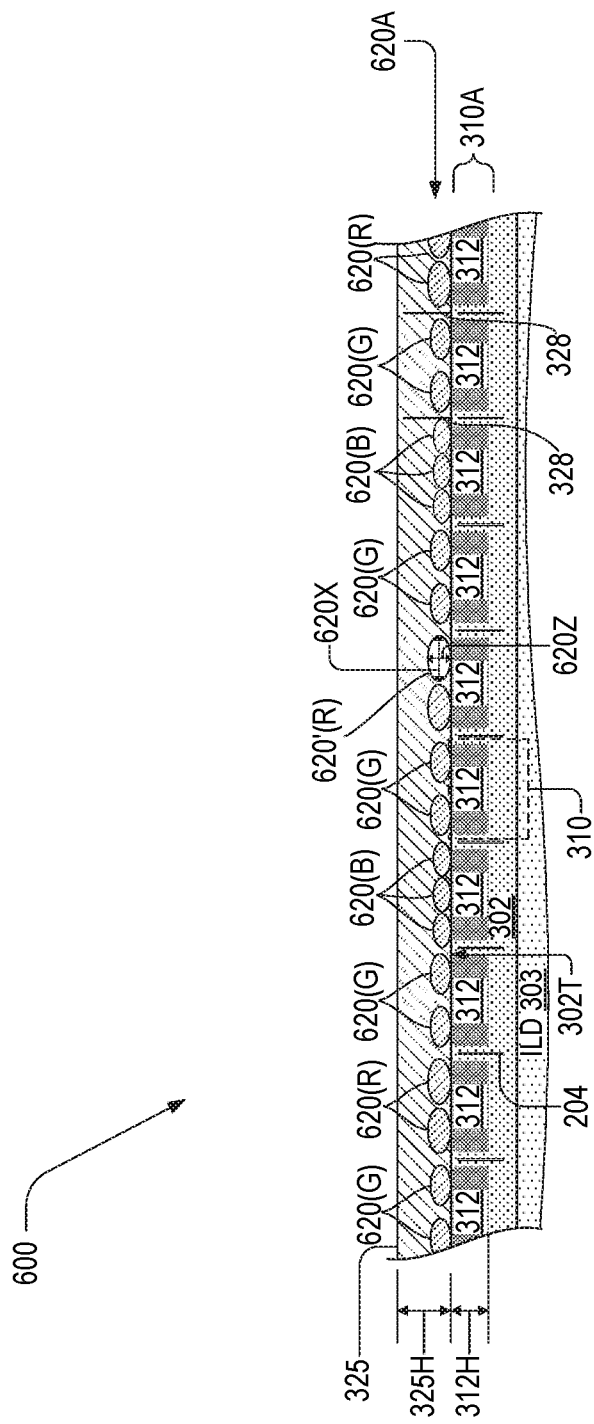
FIG. 6 is a cross-sectional view of a second resonant-filter image sensor, in an embodiment.

Wavelength λ denotes the wavelength of light in the medium surrounding microresonators 320, for example $n_{325}$ of low-index layer 325. FIG. 6 is a cross-sectional view of a resonant-filter image sensor 600 that includes pixel array 310A and a microresonator layer 620A thereon. Resonant-filter image sensor 600 is an example of resonant-filter image sensor 300. Microresonator layer 620A includes a plurality of microresonators 620 that are each oblate spheroids.

Microresonators 620(B), 620(G), and 620(R) are examples of microresonators 421, 422, and 423, respectively. Each microresonator 620 has a semi-major axis a parallel to top surface 302T and a semi-minor axis b perpendicular to top surface 302T. For example, microresonator 620'(R) has a semi-major axis 620X (length a) and a semi-minor axis 620Z (length b). Microresonator layer 620A may be coated with low-index layer 325. Resonant-filter image sensor 600 may include one or more baffles 328.

Figure 7:
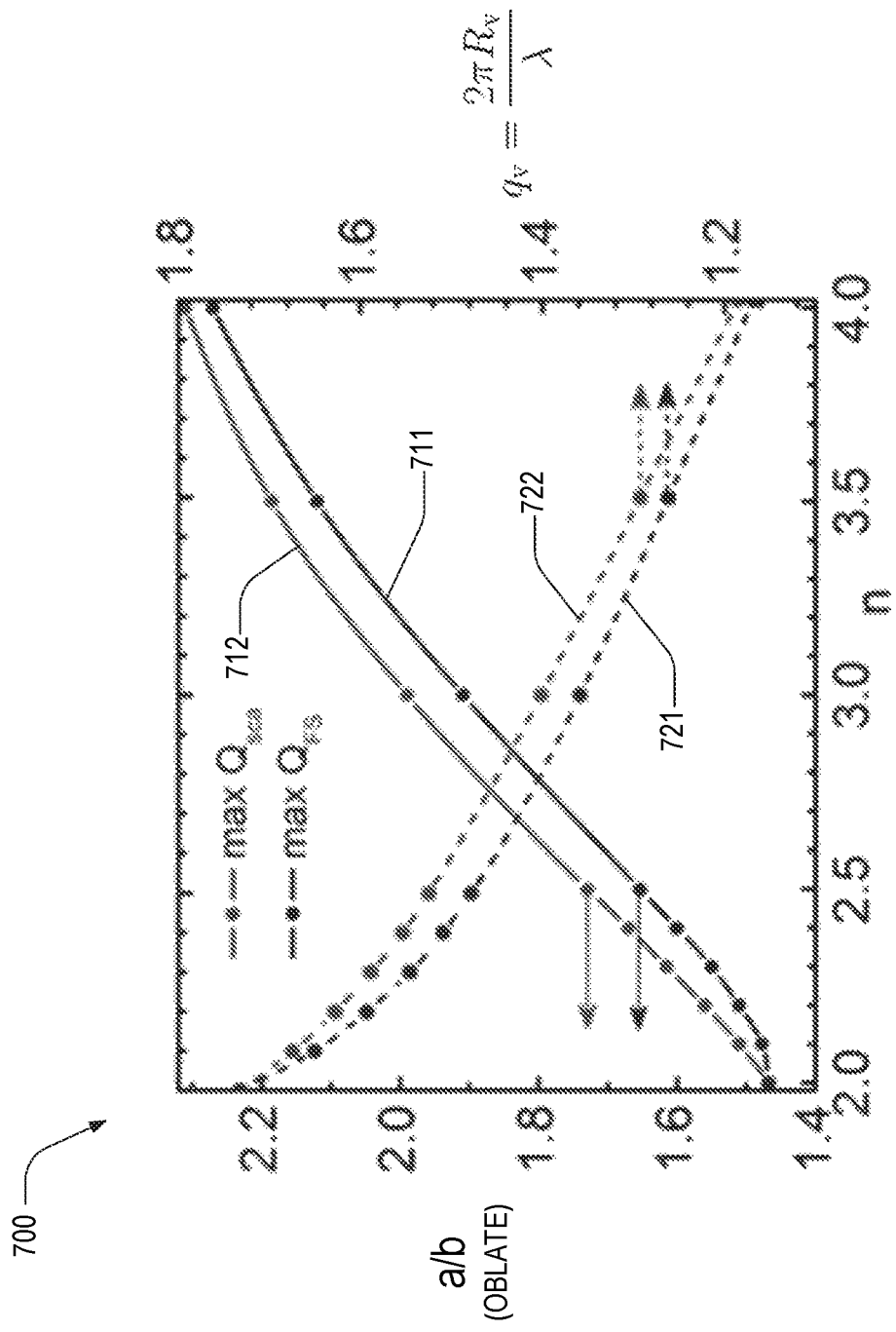
FIG. 7 is a graph showing optimum shape and size parameter q for spheroidal particles as a function of their refractive index.

FIG. 7 is a graph 700 showing optimum ratio a/b and size parameter q, for spheroidal particles as a function of their refractive index. FIG. 7 is reproduced from Luk'yanchuk et al. (*ACS Photonics*, 2015, 2 (7), pp 993-999). Size parameter $q_v = 2\pi R_v/\lambda$, where $R_v^3 = a^2 b$ and λ is the wavelength in the medium surrounding the spheroidal particle. Curves 711 and 712 denote values of size parameter $q_v$ that yields maximum forward scattering and maxim total scattering, respectively, as a function of refractive index n. Curves 721 and 722 denote values of $$\frac{a}{b}$$

that yield maximum forward scattering and maximum total scattering respectively, as a function of refractive index n. Table 1 is derived from FIG. 7 and presents ranges of size parameter $q_v$ and ratio $$\frac{a}{b}$$

for microresonators 620 having refractive index $n_{520}\pm0.05$ that may be included in microresonator layer 620A. Microresonators 620 may have parameters not included in Table 1 corresponding to interpolation of values therein or by inspection of graph 700. Ratios $$\frac{a}{b}$$

may correspond to microresonators 620 having a non-spheroidal shape, such as a cylinder or a parallelepiped.

TABLE 1

Exemplary parameters of spheroidal microresonators 620

| $n_{520}$ | min(a/b) | max(a/b) | min(q) | max(q) |
| --- | --- | --- | --- | --- |
| 2.0 | 1.43 | 1.46 | 1.73 | 1.75 |
| 2.1 | 1.47 | 1.52 | 1.65 | 1.69 |
| 2.2 | 1.50 | 1.57 | 1.59 | 1.65 |
| 2.3 | 1.54 | 1.63 | 1.54 | 1.60 |
| 2.4 | 1.58 | 1.69 | 1.50 | 1.57 |
| 2.5 | 1.65 | 1.74 | 1.47 | 1.54 |
| 2.7 | 1.74 | 1.84 | 1.41 | 1.49 |
| 2.8 | 1.80 | 1.90 | 1.39 | 1.46 |
| 3.0 | 1.90 | 2.01 | 1.34 | 1.41 |
| 3.5 | 2.11 | 2.20 | 1.24 | 1.29 |
| 4.0 | 2.26 | 2.32 | 1.14 | 1.18 |

Figure 8:
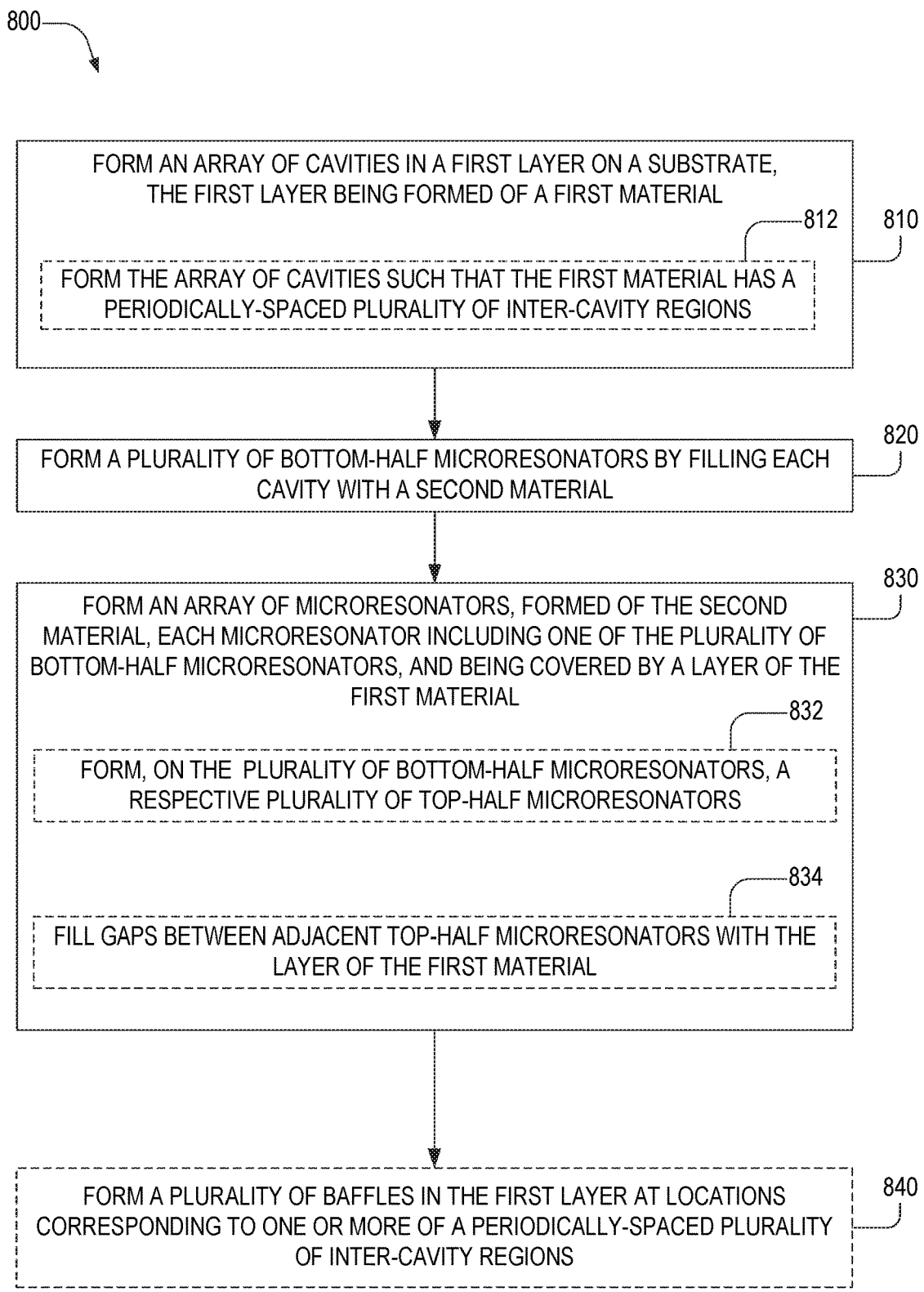
FIG. 8 is a flowchart illustrating a method for forming a microresonator array on a substrate, in an embodiment.

FIG. 8 is a flowchart illustrating an exemplary method 800 for forming a microresonator array on a substrate. FIGS. 9A, 9B, and 9C show cross-sectional views of pixel array 310A corresponding to steps of method 800. FIGS. 8 and 9A-9C are best viewed together with the following description.

In step 810, method 800 forms an array of cavities within a first layer on the substrate. Step 810 may be performed using nanoimprint lithography. In an example of step 810, an array 922A of cavities 922 is formed in a low-index layer 921 on semiconductor layer 302, as shown in FIG. 9A. The first layer of step 810 corresponds to that of low-index layer 921. Cavities 922 are for example hemispherical or hemispheroidal with a radius corresponding to a radius of a microresonator 320. Low-index layer 921 may be formed of the same material as low-index layer 325.

Step 810 may include step 812. In step 812, method 800 forms the array of cavities such that the first layer has a periodically-spaced plurality of inter-cavity regions. In an example of step 812, cavities 922 is formed in low-index layer 921, which has a plurality of inter-cavity regions 924 that are each between a pair of periodically-spaced photodiode regions 312.

In step 820, method 800 forms a plurality of bottom-half microresonators by filling each cavity with a second material. The second material may have a higher refractive index than the first material. In an example of step 820, cavities 922 are filled to form a plurality of bottom-half microresonators 923 formed thereof, as shown in FIG. 9B.

In step 830, method 800 forms an array of microresonators, formed of the second material, each microresonator including one of the plurality of bottom-half microresonators, and being covered by a layer of the first material. In an example of step 830, microresonator layer 320A is formed (FIG. 3), wherein each microresonator 320 includes a bottom-half microresonator 923, as shown in FIG. 9C.

Step 830 may be performed using nanoimprint lithography. For example, step 830 may include step 832, in which method 800 forms, on the plurality of bottom-half microresonators, a respective plurality of top-half microresonators. Each top-half microresonator is, for example, exclusively above only its respective bottom-half microresonator, such that it is not above any other bottom-half microresonator. In an example of step 832, one of a plurality of top-half microresonators 932 are formed on a respective one of the plurality of bottom-half microresonators 923. Each bottom-half microresonator 923 and its respective top-half microresonator may 932 may be formed of the same material, and together are an example of microresonator layer 320A (FIG. 3).

Adjacent top-half microresonators 932 are separated by a gap 933. Step 830 may also include step 834, in which method 800 fills gaps between adjacent top-half microresonators with the layer of the first material. In an example of step 834, gaps 933 are filled with by depositing a low-index layer 925 on top-half microresonators 932 and regions of low-index layer 921 between adjacent top-half microresonators 932. This low-index layer is an example of low-index layer 325, FIG. 3

Step 840 is optional. In step 840, method 800 forms a plurality of baffles in the first layer at locations corresponding to one or more of a plurality of periodically-spaced inter-cavity regions. The plurality of periodically-spaced inter-cavity regions result from step 812, for example. In an example of step 840, baffles 328 are formed in low-index layer 325. Step 850 may be performed using nanoimprint lithography.

Combinations of Features

Features described above as well as those claimed below may be combined in various ways without departing from the scope hereof. The following examples illustrate some possible, non-limiting combinations:

(A1) A resonant-filter image sensor includes a pixel array including a plurality of pixels and a microresonator layer above the pixel array. The microresonator layer includes a plurality of microresonators formed of a first material with an extinction coefficient less than 0.02 at a free-space wavelength of five hundred nanometers.

(A2) In the resonant-filter image sensor denoted by (A1), each of the plurality of pixels may have at least one of the plurality of microresonators at least partially thereabove.

(A3) Any resonant-filter image sensor denoted by one of (A1) and (A2) may further include a low-index layer covering the microresonator layer that has a second refractive index less than a first refractive index, the first refractive index being the refractive index of the first material.

(A4) The resonant-filter image sensor denoted by (A3), in which each pixel includes a photodiode region, may further include a plurality of baffles each located (a) in the low-index layer and (b) above a position in the pixel array between adjacent photodiode regions. Each baffle may have a refractive index less than the second refractive index.

(A5) In any resonant-filter image sensor denoted by one of (A1) through (A4), each microresonator may be one of a parallelepiped, a cylinder, a spheroid, and a sphere.

(A6) In any resonant-filter image sensor denoted by one of (A1) through (A5), the plurality of microresonators may include a first microresonator adjacent to and not in contact with a second microresonator, the first and second microresonators each being at least partially above the same pixel.

(A7) In any resonant-filter image sensor denoted by one of (A1) through (A6), in which (a) the first material has a first refractive index $n_1=1.6$ at a free-space wavelength $\lambda_0$, and (b) a medium above the plurality of microresonators has refractive index $n_2$, each microresonator may have a radius denoted by r and a size parameter $$q = \frac{2\pi n_1 r}{\lambda_0 / n_2}$$

that equals one of: 3.3, 4.0, 4.8, 5.5, 6.2, 6.9, 7.7, 8.4, 9.1, and 9.8 to within ±0.1.

(A8) In any resonant-filter image sensor denoted by (A7), wavelength $\lambda_0$ may be in one of the following ranges: (a) 450±25 nm, (b) 530±25 nm, (c) 600±25 nm, and (d) 800±25 nm.

(A9) In any resonant-filter image sensor denoted by one of (A1) through (A7), each microresonator may be a sphere having a diameter D and a refractive index n, and may satisfy, at a free-space wavelength $\lambda_0$, one of (a) $D=\lambda_0/4$ and $n(\lambda_0)=3.82\pm0.2$, (b) $D=\lambda_0/2$ and $n(\lambda_0)\geq2.7$, and (c) $D=\lambda_0$ and $n(\lambda_0)$ satisfying one of $n(\lambda_0)=1.75\pm0.2$, $n(\lambda_0)=2.1\pm0.2$, and $n(\lambda_0)=2.4\pm0.2$.

(A10) In any resonant-filter image sensor denoted by (A9), wavelength $\lambda_0$ may be in one of the following ranges: (a) 450±25 nm, (b) 530±25 nm, (c) 600±25 nm, and (d) 800±25 nm.

(A11) In any resonant-filter image sensor denoted by one of (A1) through (A10), a medium above the plurality of microresonators having refractive index $n_2$, each microresonator may: be a sphere with radius r, have a refractive index $n_1=2.47\pm0.1$ at a free-space wavelength $\lambda_0$ between 0.4 μm and 2.0 μm, and have a size parameter $$q = \frac{2\pi n_1 r}{\lambda_0 / n_2} = 2.75 \pm 0.1.$$

(A12) In any resonant-filter image sensor denoted by one of (A1) through (A11), the plurality of pixels are formed in a semiconductor layer having a top surface, at least one of the plurality of pixels may have a photodiode region, in the semiconductor layer, extending less than five micrometers from the top surface.

(A13) In any resonant-filter image sensor denoted by one of (A12), the photodiode region may be between the top surface and at least one of (i) opaque element and (ii) an inter-layer dielectric, located less than five micrometers from the top surface.

(A14) In any resonant-filter image sensor denoted by one of (A1) through (A13), the plurality of pixels includes a first pixel, a second pixel, and a third pixel. A first of the plurality of microresonators is located above the first pixel and has a first diameter. A second of the plurality of microresonators is located above the second pixel and has a second diameter. A third of the plurality of microresonators is located above the third pixel and has a third diameter. The first, second, and third diameter may be different from one another.

(A15) In any resonant-filter image sensor denoted by (A14), the plurality of pixels may include a first periodic array of first pixels, a second periodic array of second pixels, and a third periodic array of third pixels, the first, second, and third periodic arrays being interleaved to yield a composite array where the location of each first pixel, second pixel, and third pixel corresponds to a location of a red, green, and blue color filter, respectively, of a Bayer pattern (B1) A method for forming a microresonator array on a substrate includes (a) forming an array of cavities in a first layer on the substrate, wherein the first layer is formed of a first material. The method also includes (b) forming a plurality of bottom-half microresonators by filling each cavity with a second material, and (c) forming an array of microresonators, formed of the second material, each microresonator including one of the plurality of bottom-half microresonators, and being covered by a layer of the first material.

(B2) In the method denoted by (B1), the substrate may include a pixel array formed of a plurality of pixels each having a respective photodiode region.

(B3) In the method denoted by (B2), the step of forming an array of cavities may further include forming the array of cavities such that the first layer has a periodically-spaced plurality of inter-cavity regions each located above a position in the pixel array between adjacent photodiode regions.

(B4) Any method denoted by (B3) may further include forming a plurality of baffles in one or more of the periodically-spaced inter-cavity regions.

(B5) In any method denoted by (B1) through (B3), the step of forming an array of microresonators may further include forming, on the plurality of bottom-half microresonators, a respective plurality of top-half microresonators.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for forming a microresonator array on a substrate, the method comprising:
    forming an array of cavities in a first layer on the substrate, the first layer being formed of a first material that has a refractive index $n_2$ at free-space wavelength $\lambda_0 = 600$ nm, each cavity of the array of cavities having a width that is less than or equal to $\lambda_0/n_2$;
    forming a plurality of bottom-half microresonators by filling each cavity of the array of cavities with a second material; and
    forming an array of microresonators, formed of the second material, each microresonator of the array of microresonators including one of the plurality of bottom-half microresonators, and being covered by a layer of the first material.

2. The method of claim 1, the substrate including a pixel array formed of a plurality of pixels each having a respective photodiode region.

3. The method of claim 2, the step of forming an array of cavities comprising forming the array of cavities such that the first layer has a plurality of periodically-spaced inter-cavity regions each located above a position in the pixel array between adjacent photodiode regions.

4. The method of claim 3, further comprising forming a plurality of baffles in one or more of the periodically-spaced inter-cavity regions.

5. The method of claim 1, the step of forming an array of microresonators further comprising: forming, on the plurality of bottom-half microresonators, a respective plurality of top-half microresonators.

\* \* \* \* \*